United States Patent [19]

Kameya

[11] Patent Number: 5,053,730
[45] Date of Patent: Oct. 1, 1991

[54] TERMINAL STRUCTURE FOR ELECTRONIC COMPONENTS

[75] Inventor: Kazuo Kameya, Tokyo, Japan
[73] Assignee: Elmec Corporation, Kawasaki, Japan
[21] Appl. No.: 554,888
[22] Filed: Jul. 20, 1990
[30] Foreign Application Priority Data Jul. 21, 1989 [JP] Japan .................................. 1-189572

[51] Int. Cl.$^5$ .......................... H03H 7/38; H01P 1/18
[52] U.S. Cl. ..................................... 333/33; 333/161; 333/246
[58] Field of Search .................... 333/32, 33, 161, 156, 333/140, 238, 246, 260; 439/68-70, 72, 78

[56] References Cited

U.S. PATENT DOCUMENTS 4,224,637  9/1980  Hargis .............................. 439/69 X
4,600,907  7/1986  Grellman et al. .................. 333/246
4,701,723 10/1987  Kameya ............................. 333/33

Primary Examiner—Eugene R. LaRoche
Assistant Examiner—Seung Ham
Attorney, Agent, or Firm—Fish & Richardson

[57] ABSTRACT

By appropriately determining the dimensions and positional relationships of the terminal pieces of an electronic component such as an electromagnetic delay line, the terminal pieces are capable of conducting super high speed signals without unduly attenuating or reflecting them. A signal terminal piece and a ground terminal piece situated in a common plane so as to define a gap G filled with dielectric material therebetween form an impedance line having a desired characteristic impedance. By selecting the gap from a range between 0.1 mm and 0.6 mm, it is possible to obtain a normally desired characteristic impedance when the dimensions of the terminal pieces and related parts are set to practical values. When a pair of ground terminal pieces are arranged on either side of a signal terminal piece, each of the gaps may be selected from a range between 0.1 mm and 1.0 mm when the gaps are air gaps, and from a range between 0.2 mm and 1.5 mm when the gaps are filled with dielectric material such as epoxy resin.

12 Claims, 7 Drawing Sheets

TERMINAL STRUCTURE FOR ELECTRONIC COMPONENTS

TECHNICAL FIELD

The present invention relates to a terminal structure for electronic components, in particular to improvement of a terminal structure for electronic components including an impedance structure for handling super high speed signals in a range between 1 GHz and 5 GHz.

BACKGROUND OF THE INVENTION

Conventionally, for such an electronic component, which for instance may consist of a super high speed electromagnetic delay line, a ground electrode is formed on the reverse surface of a rectangular dielectric base plate, and an electroconductive line folded back and forth along the widthwise direction of the base plate as it extends along its longitudinal direction is formed on the front surface of the dielectric base plate. Terminal pieces connected to the ground electrode and the electroconductive line project from an end of the dielectric base plate.

According to such an electromagnetic delay line, since the electroconductive line serving as a delay line device forms a super high speed impedance line of approximately 50 ohms, it can be connected to an impedance circuit of a printed circuit board in a favorable matching condition only when an appropriate impedance line typically constructed as a micro strip of 50 ohms is formed in this printed circuit board.

However, according to such an electromagnetic delay line equipped with terminal pieces, the terminal pieces have a certain inductive component and often do not form an impedance line of 50 ohms. Conventionally, the impedance of terminal pieces has been disregarded. Therefore, it often happened in the past that the frequency property was impaired by the mismatch at the terminal pieces even when the frequency property of the electroconductive line was quite favorable, and that the electroconductive line was thereby rendered unable to produce a desired super high speed property.

It is conceivable to make a part of the ground electrode oppose the signal terminal piece with a dielectric body placed therebetween and form a distributed capacitance between the signal terminal piece and the ground electrode so as to utilize the signal terminal piece as an appropriate impedance line similar to a micro strip line and to prevent a mismatch at the signal terminal piece. However, according to such a structure, it is necessary to form a dielectric body and a ground terminal in a certain fixed relationship with the signal terminal piece, and its fabrication process is inevitably made substantially more complex.

BRIEF SUMMARY OF THE INVENTION

In view of such problems of the prior art, a primary object of the present invention is to provide a terminal structure for electronic components having a terminal piece for external connection which can be easily formed as an impedance line having a desired characteristic impedance value.

A second object of the present invention is to provide a terminal structure for electronic components which can receive and supply super high speed signals at its terminal piece without unduly attenuating or reflecting them.

A third object of the present invention is to provide a terminal structure for electronic components which can be easily formed as a desired impedance line without requiring any special component parts.

These and other objects of the present invention can be accomplished by providing a terminal structure for electronic components, comprising: a base plate of an electronic component such as an electromagnetic delay line including an impedance circuit and a ground circuit; a signal terminal piece consisting of an electroconductive planar member connected to the impedance circuit at its one end and projecting from the base plate; a ground terminal piece consisting of an electroconductive planar member connected to the ground circuit at its one end and projecting from the base plate in a common plane as the signal terminal piece so as to define a gap G therebetween; external connecting pieces integrally projecting from the signal terminal piece and the ground terminal piece, respectively, and each having a comparatively narrower width; and a solid dielectric body interposed at least between the signal terminal piece and the ground terminal piece; the gap being in a range between 0.1 mm and 0.6 mm.

Thus, the signal terminal piece opposing the ground terminal piece situated in a common plane so as to define a gap G filled with dielectric material therebetween forms an impedance line having a desired characteristic impedance. By selecting the gap from a range between 0.1 mm and 0.6 mm, it is possible to obtain a normally desired characteristic impedance when the dimensions of the terminal pieces and related parts are set to practical values.

According to another embodiment of the present invention, there is provided a terminal structure for electronic components, comprising: a base plate of an electronic component including an impedance circuit and a ground circuit; a signal terminal piece consisting of an electroconductive planar member connected to the impedance circuit at its one end and projecting from the base plate; a pair of ground terminal pieces each consisting of an electroconductive planar member connected to the ground circuit at its one end and projecting from the base plate in a common plane as the signal terminal piece on either side of the signal terminal piece so as to define a gap G therebetween; and external connecting pieces integrally projecting from the signal terminal piece and the ground terminal pieces, respectively, at least the external connecting piece projecting from the signal terminal piece having a comparatively narrower width; the gap being in a range between 0.1 mm and 1.0 mm.

Thus, the signal terminal piece opposing the ground terminal pieces situated in a common plane so as to define an air gap G therebetween forms an impedance line having a desired characteristic impedance. By selecting the gap from a range between 0.1 mm and 1.0 mm, it is possible to obtain a normally desired characteristic impedance when the dimensions of the terminal pieces and related parts are set to practical values.

When the gaps are filled with dielectric material such as epoxy resin, the gap G may be increased to the range between 0.2 mm and 1.5 mm.

Typically, the terminal pieces each comprise an internal connecting piece fitted into a through hole of the base plate, a main part of the terminal piece integral with the internal connecting piece at its one end, and an external connecting piece having a relatively small width projecting from another end of the main part.

BRIEF DESCRIPTION OF THE DRAWINGS

Now the present invention is described in the following with reference to the appended drawings, in which.

DETAILED DESCRIPTION OF THE PREFERRED EMBODIMENTS

First Embodiment

Figure 1:
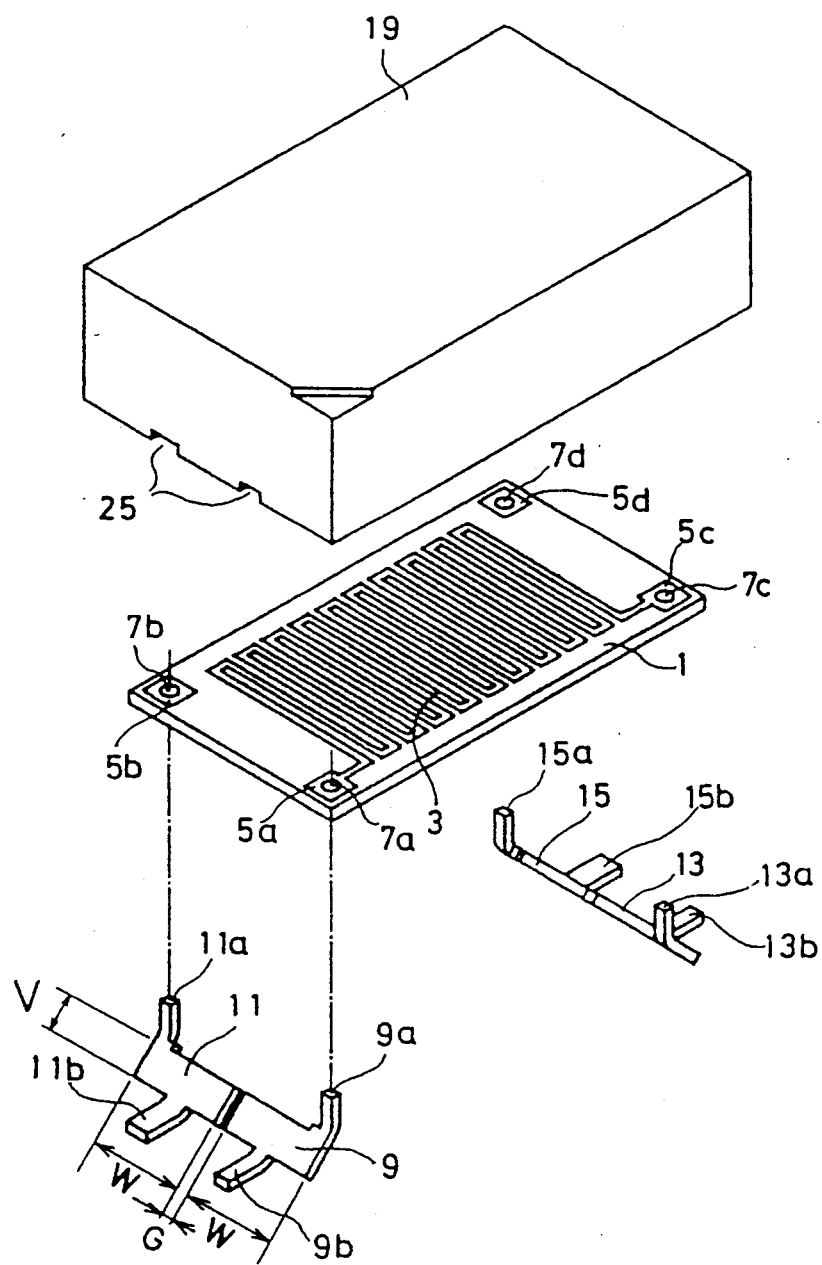
FIG. 1 is an exploded perspective view of an electromagnetic delay line to which a first embodiment of the terminal structure according to the present invention has been applied.
Figure 2:
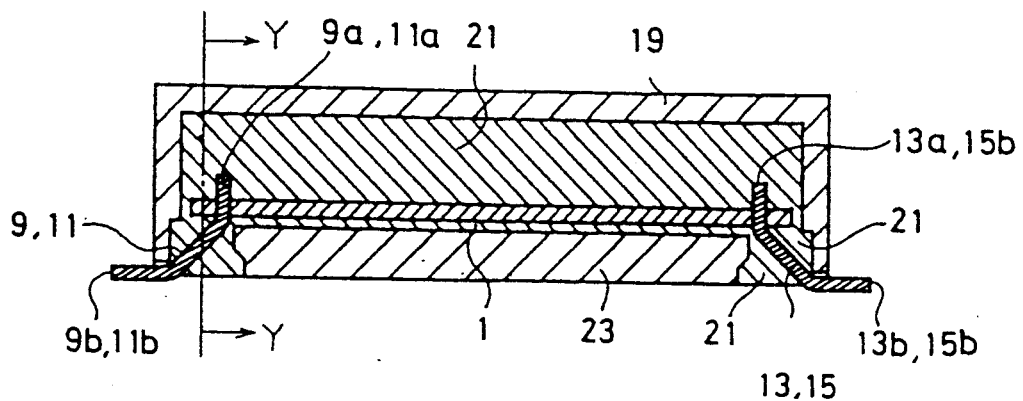
FIG. 2 is a sectional view of the terminal structure of FIG. 1.
Figure 3:
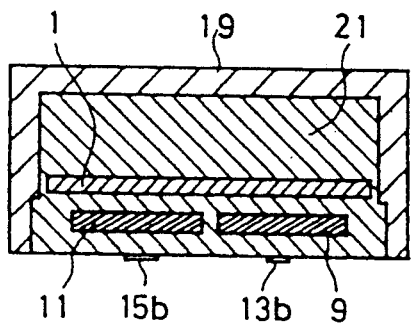
FIG. 3 is a sectional view taken along line Y—Y of FIG. 2.

Referring to FIGS. 1 through 3, a ground electrode (which is hidden in FIG. 1) is formed on the reverse surface of a rectangular main base plate 1 made of dielectric material, and an electroconductive line 3 folded laterally back and forth along the entire longitudinal length of the base plate serving as an impedance line is formed on the front surface of the base plate 1 so as to oppose the ground electrode.

Four corner portions of the base plate 1 are provided with connecting pads 5a through 5d, respectively, and through holes 7a through 7d are formed in these connecting pads 5a through 5d, respectively. The connecting pads 5a and 5b are used as an input end while the connecting pads 5c and 5d are used as an output end.

An end of the electroconductive line 3 is connected to the connecting pad 5a at its one end and to the connecting pad 5c at its other end. The connecting pads 5b and 5d are connected to the ground terminal via the through holes 7b and 7d.

A short internal connecting piece 9a projecting (upwards as seen in FIG. 1) from an input signal terminal piece 9 is fitted into the through hole 7a of the base plate 1, and is soldered to the connecting pad 5a. A similar internal connecting piece 11a projecting from a ground terminal piece 11 is likewise fitted into the through hole 7b, and is soldered thereto. Short internal connecting pieces 13a and 15a projecting from an output signal terminal piece 13 and a ground terminal piece 15, respectively, are fitted into the through holes 7c and 7d, respectively, and are soldered to the connecting pads 5c and 5d, respectively.

The input signal terminal piece 9 and the ground terminal piece 11 are each provided with a width W, and are disposed on a substantially common plane defining a spacing of G therebetween. The input signal terminal piece 9 and the ground terminal piece 11 are bent away from the base plate 1 at the base ends of the short internal connecting pieces 9a and 11a. From the free ends or the other ends of the input signal terminal piece 9 and the ground terminal piece 11 project a pair of short and narrow external connecting pieces 9b and 11b substantially in parallel with the base plate 1 so that this electromagnetic delay line may be mounted on a printed circuit board by placing these connecting pieces 9b and 11b on appropriate parts of the printed circuit board and soldering them thereto.

Likewise, the output signal terminal piece 13 and the ground terminal piece 15 are each provided with a width W, and are disposed on a substantially common plane defining a spacing of G therebetween. The output signal terminal piece 13 and the ground terminal piece 15 are bent away from the base plate 1. From the free ends or the other ends of the output signal terminal piece 13 and the ground terminal piece 15 project a pair of short and narrow external connecting pieces 13b and 15b.

According to the present invention, impedance lines (V) are formed between parts of the signal terminal pieces 9 and the ground terminal piece 11 and between the signal terminal piece 13 and the ground terminal piece 15 excluding the internal connecting pieces 9a, 13a, 9b and 13b. In particular, an important point of the present invention the selection of the spacing G defined between the signal terminal piece 9 and the ground terminal piece 11 and between the signal terminal piece 13 and the ground terminal piece 15 as described hereinafter.

Figure 4:
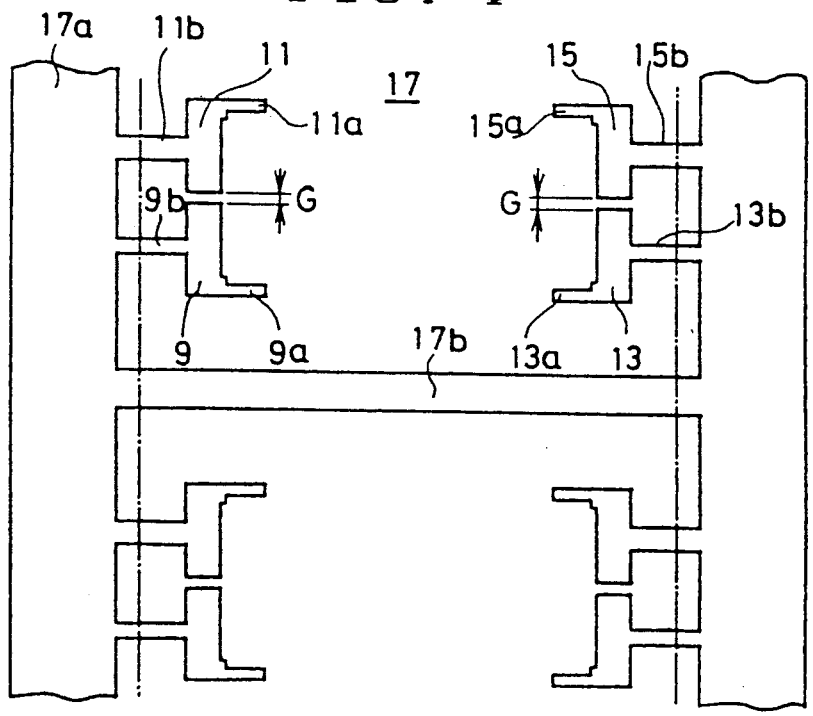
FIG. 4 is a plan view of a lead frame for fabricating the terminal pieces of FIG. 1.
Figure 5:
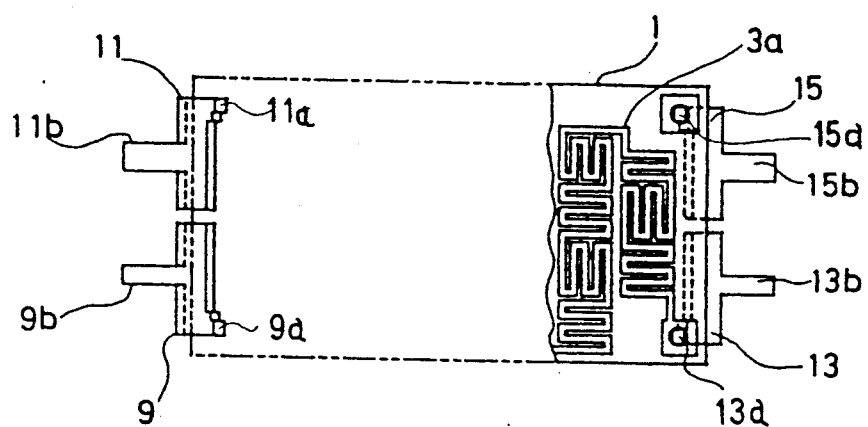
FIG. 5 is a broken away plan view of the electromagnetic delay line revealing the structure for connecting the electromagnetic delay line main body with the terminal pieces.

Referring to FIG. 4, the signal terminal pieces 9 and 13 and the ground terminal pieces 11 and 15 are connected with each other by a frame portion 17a and connecting portion 17b in a lead frame 17 from which they are made. This lead frame 17 may be made by stamping sheet metal made of phosphor bronze or the like. After the main parts of the terminal pieces and the external connecting pieces 9b, 11b, 13b and 15b are bent upward and the internal connecting pieces 9a, 11a, 13a and 15a of the signal terminal pieces 9 and 13 and the ground terminal pieces 11 and 15 are connected to the base plate 1 as shown in FIG. 5, the frame portion 17a and the connecting pieces 17b are cut off as indicated by the chain-dot lines in FIG. 4.

Figure 6:
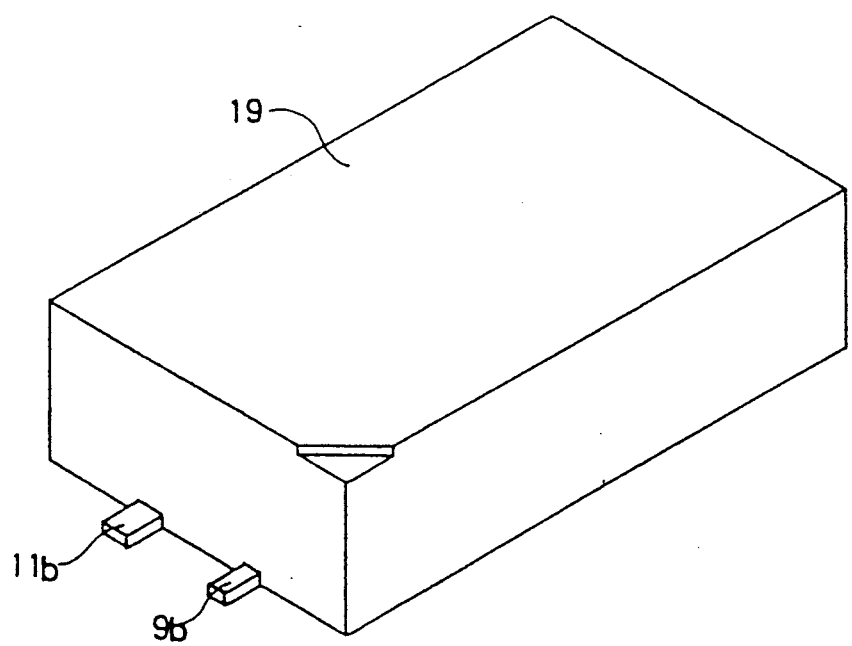
FIG. 6 is a perspective view showing the assembled state of the electromagnetic delay line.

Once the signal terminal pieces 9 and 13 and the ground terminal pieces 11 and 15 are connected to the base plate 1, the base plate 1 is placed in a box-shaped case 19, and an epoxy or other filling agent is filled into the case 19, as illustrated in FIGS. 2 and 3. An open end of the case 19 exposing the reverse surface of the base plate 1 is closed by a bottom lid 23. Thus, the filling agent 21 permeates the gaps between the signal terminal pieces 9 and 13 and the ground terminal pieces 11 and 15 as a solid dielectric body, and only the external connecting pieces 9b through 15b are exposed out of the case 19 and the filling agent 21. Numeral 25 in FIG. 1 denotes notches in the case 19 for leading the connecting pieces 9b and 11b out of the case 19. FIG. 6 shows the external appearance of the electromagnetic delay line when it is fully assembled.

Generally, an impedance line is formed when a pair of electroconductive paths are opposed to each other across a dielectric body. The inventor has made various studies on the widths of the terminal pieces of electromagnetic delay lines having such terminal pieces for external connection as well as their relative arrangements, and has discovered the following facts.

The characteristic impedance of the signal terminal piece 9, for instance, can be given as a mathematical function of the thickness and width of the signal terminal piece 9 and the ground terminal piece 11, the gap G between the signal terminal piece 9 and the ground terminal piece 11, and the relative dielectric coefficient therebetween. Generally, the characteristic impedance decreases as the thickness, the widths and the relative dielectric coefficient are increased, and increases as the gap G is increased.

It was also found that terminal pieces having commonly desired characteristic impedances such as 50 ohms and 75 ohms which are used in normal transmission lines may have ranges of dimensions which are quite practical.

Figure 7:
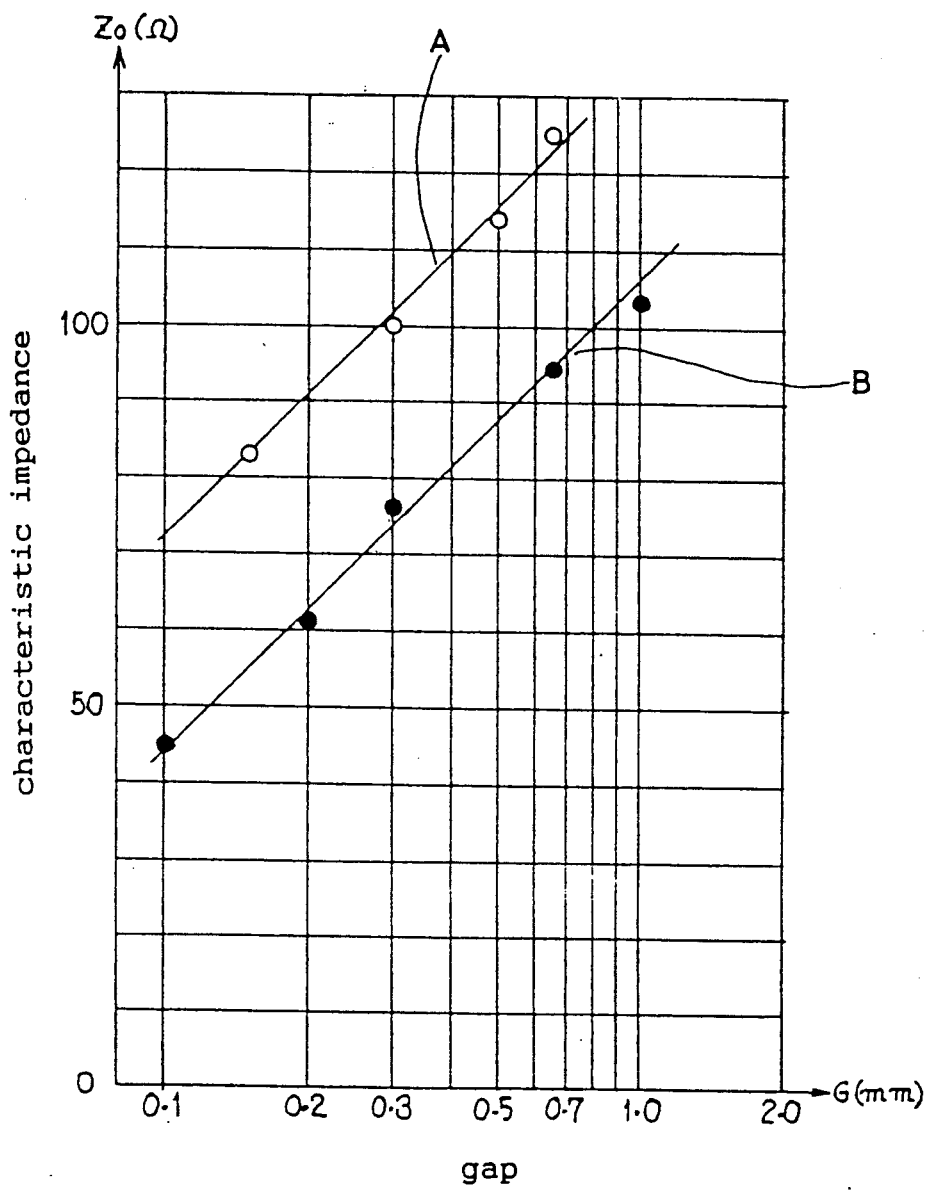
FIG. 7 is a graph showing the relationship between the spacing of the terminal pieces and the characteristic impedance.

The inventor used a signal terminal piece 9 and a ground terminal piece 11 which are each 0.25 mm in thickness and 2.2 mm in width under the conditions that the relative dielectric coefficient between the signal terminal piece 9 and the ground terminal piece 11 is 1.0 (air) and approximately 3.5 (epoxy resin), and it was found that the characteristic impedance changed as given in FIG. 7 for different values of the gap G.

As can be seen from FIG. 7, to achieve a characteristic impedance of 50 ohms when an air gap is defined between the signal terminal piece 9 and the ground terminal piece 11, it can be estimated by extrapolation that the gap G should be approximately 0.045 mm. However, arranging the signal terminal piece 9 and the ground terminal piece 11 in such a proximity creates some difficulty in view of the fact that the terminal pieces are subjected to external forces. On the other hand, when a solid dielectric body made of epoxy resin is interposed between the signal terminal piece 9 and the ground terminal piece 11, the gap G will be approximately 0.13 mm, and it is a quite acceptable and practical size. When a characteristic impedance of 75 ohms is desired, and epoxy resin is interposed between the signal terminal piece 9 and the ground terminal piece 11, the gap G will be approximately 0.3 mm. Since epoxy resin is provided with a high mechanical rigidity, and the signal terminal piece 9 and the ground terminal piece 11 are favorably secured thereby, they are capable of withstanding a substantially large external force, and can offer a highly stable characteristic.

In recent years, the terminal pieces of electronic component parts mounted on printed circuit boards have been progressively reduced, and the thickness of such terminal pieces is typically 0.25 mm while the pitch of terminal pieces is typically 2.54 mm. Therefore, since the width of 2.2 mm is a relatively large value, a terminal piece which is 0.25 mm in thickness and 2.2 mm in width is considered to be close to the limit of the practical range. Also, in the GHz frequency range, the characteristic impedance is typically 50 ohms, and at most 75 ohms.

As for the material selection of the dielectric body for super high frequency, epoxy resin has a relative dielectric coefficient of up to 5.0 and involves a relatively large loss while fluoride resin has a relatively low dielectric coefficient of approximately 2.0 but involves a relatively small loss. Epoxy resin is preferred because it has a relatively high relative dielectric coefficient which may be as high as 5.0, and the values in the order of 3.5 can be readily obtained. Epoxy resin is widely used as thermo-setting resin in various electronic component parts, and is particularly suitable for use in the present invention for the purpose of maintaining the gap between the terminal pieces simply by filling the resin in the gap and letting it cure in situ.

The relatively large super high frequency loss of epoxy resin is not a serious problem because the length of the signal terminal pieces 9 and 13 serving as impedance lines is quite short.

Thus, when a solid dielectric body is interposed between a signal terminal piece 9 and a ground terminal piece 11 which are placed side by side, an impedance line having a desired characteristic impedance can be obtained by selecting the gap G in the range between 0.1 mm and 0.6 mm when dimensional tolerance and possible dimensional errors are considered. When epoxy resin having a dielectric coefficient of 3.5 is used, the gap G will be selected from the range between 0.1 mm and 0.4 mm.

According to the structure in which solid dielectric bodies are interposed between signal terminal pieces 9 and 13 and ground terminal pieces 11 and 15 and the gaps G are selected from the range between 0.1 mm and 0.6 mm, when the signal terminal pieces are placed close to the connecting patterns of the printed circuit board, and constructed as impedance lines having favorable transmission properties, the attenuation and reflection of super high speed signals at the terminal pieces can be controlled. Also, the favorable impedance lines can be formed simply by normal lead frames for forming normal terminal pieces without requiring any special component parts, and advantages of economy and reliability can be thereby obtained.

Since the external connecting pieces 9b, 11b, 13b and 15b of the signal terminal pieces 9 and 13 and the ground terminal pieces 11 and 15 are soldered to the connecting patterns of the printed circuit board by placing the terminal pieces on the connecting patterns of the printed circuit board, they may be soldered in the same way as other electronic component parts, and the impedance properties of the soldered parts are not substantially affected by the characteristic impedance of the connecting patterns of the printed circuit board.

If the gap G is maintained not only in the signal terminal pieces 9 and 13 but also in their external connecting pieces 9b and 13b, the chance of short-circuiting them during the soldering process increases, and the areas of the connecting patterns of the printed circuit board are required to be increased. This is not preferable because a relatively large electrostatic capacitance is generated between the connecting patterns of the printed circuit board and the opposing ground electrode.

Second Embodiment

Figure 8:
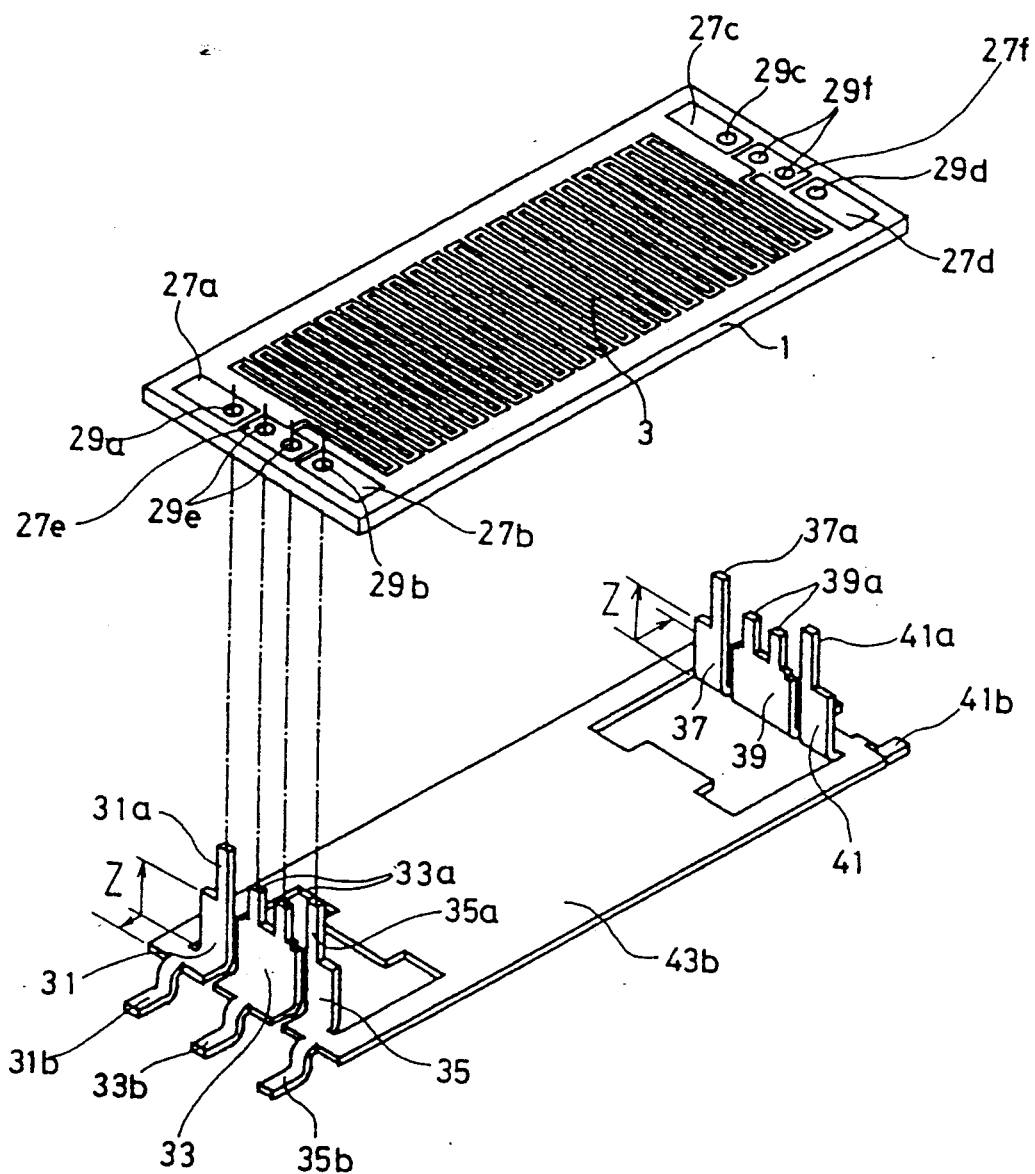
FIG. 8 is an exploded perspective view of an electromagnetic delay line to which a second embodiment of the terminal piece structure according to the present invention has been applied.

FIG. 8 shows a second embodiment of the electromagnetic delay line according to the present invention.

A base plate 1 carrying an electroconductive path 3 in a similar fashion as the base plate 1 illustrated in FIG. 1 is provided with four connecting pads 27a through 27d located at its four corners and two additional connecting pads 27e and 27f located between the connecting pads 27a and 27b and between the connecting pads 27c and 27d, respectively. The connecting pads 27a through 27f are each provided with a through hole 29a through 29f. The connecting patterns 27e and 27f are each provided with a pair of through holes 29e and 29f.

One end of the electroconductive path 3 is connected to the connecting pad 27e, and the other end of the electroconductive path 3 is connected to the connecting pad 27f. The connecting pads 27a through 27d are connected to a ground electrode (not shown in the drawings) formed on the reverse surface of the base plate 1 via the through holes 29a through 29d.

Internal connecting pieces 31a, 33a, 35a, 37a, 39a and 41a are passed through the through holes 29a through 29f, and soldered to the connecting pads 27a through 27f, respectively. These terminal pieces 31, 35, 37, 39 and 41 are originally connected together by a frame portion 43a so as to form a lead frame 43 as illustrated in FIG. 2. Since the signal terminal pieces 33 and 39 are each provided with a pair of laterally spaced internal connecting pieces 33a and 39a, the gap G between each of the signal terminal pieces 33 and 39 and each of the adjoining ground terminal pieces may be kept fixed in a stable fashion even after the connecting pieces are cut off from the frame portion 43a. The internal connecting pieces 31a, 35a, 37a and 41a of the ground terminal pieces 31, 35, 37 and 41 have a slightly larger length than the internal connecting pieces 33a and 39a of the signal terminal pieces 33 and 39 so as to facilitate the insertion of the internal connecting pieces into the associated through holes 27a and 27f.

The width W1 of the signal terminal piece 33 is slightly larger than the width W2 of the ground terminal pieces 31 and 35, and these terminal pieces are fixedly secured to the base plate so as to define a gap G between each pair of adjacent terminal pieces, and project perpendicularly from the base plate 1 and on a common plane. The outer ends of the signal terminal pieces 33 and 39 and the ground terminals 31, 33, 37 and 41 are formed into external connecting pieces 31b, 33b, 35b, 37b, 39b and 41b, respectively, having a relatively smaller width. However, the external connecting pieces 31b, 35b, 37b and 41b for the ground terminal pieces 31, 35, 37 and 41 may not be reduced in width. The external connecting pieces 37b and 39b of the ground terminal piece 37 and the signal terminal piece 39 are not visible in FIG. 8.

The signal terminal piece 33 excluding its internal connecting piece 33a and external connecting piece 33b form an impedance path (Z) in cooperation with the ground terminal pieces 31 and 35. Likewise, the signal terminal piece 39 excluding its internal connecting piece 39a and external connecting piece 39b form an impedance path (Z) in cooperation with the ground terminal pieces 37 and 41.

Figure 9:
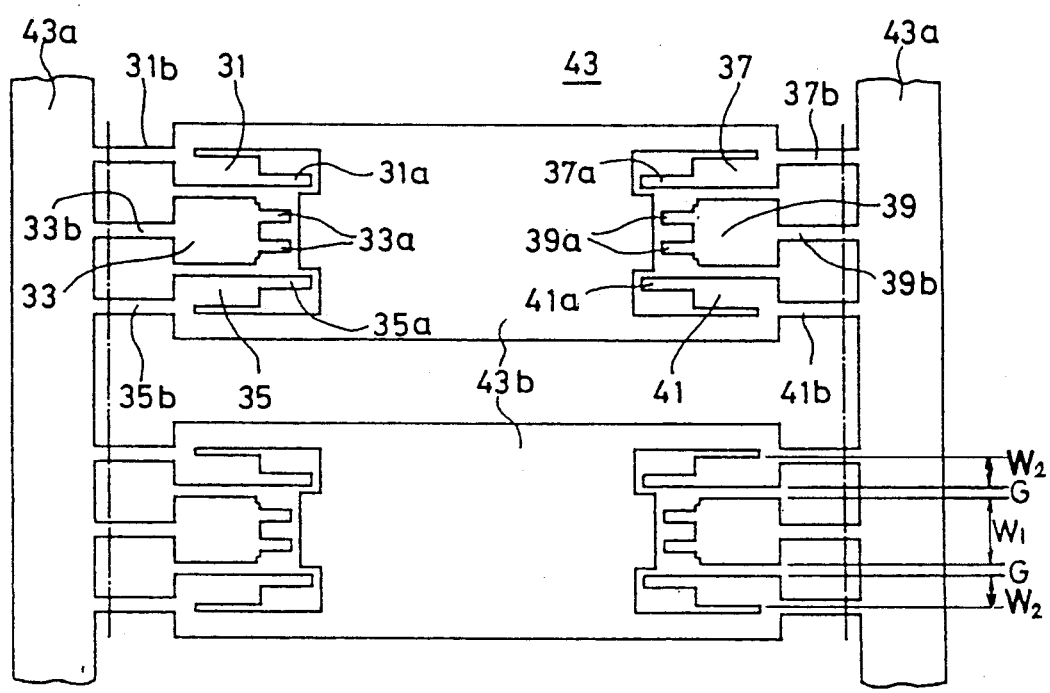
FIG. 9 is a plan view of a lead frame for fabricating the terminal pieces of FIG. 8.

As briefly mentioned earlier, the signal terminal pieces 33 and 39 and the ground terminal pieces 31, 35, 37 and 41 are originally connected with each other by a frame portion 43a and a connecting portion 43b so as to form a lead frame 43 as illustrated in FIG. 9. This lead frame 43 may be fabricated by stamping phosphor bronze plate.

Figure 10:
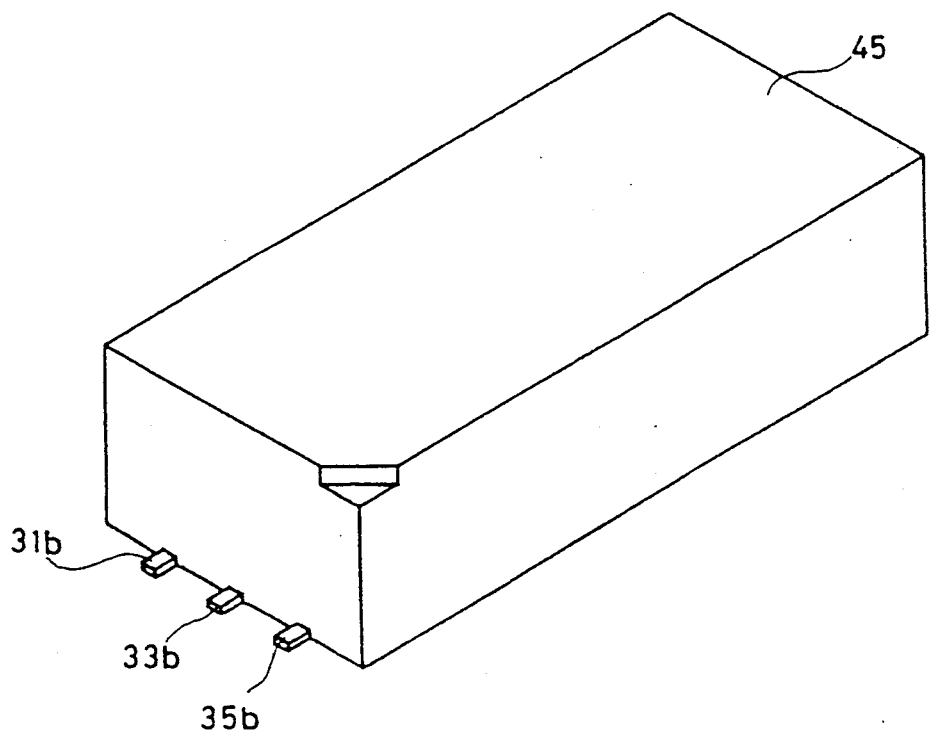
FIG. 10 is a perspective view showing the assembled state of the electromagnetic delay line.

The electromagnetic delay line is finally packaged in a case 45 similar to the case 19 of the first embodiment as illustrated in FIG. 10.

In regard to this second embodiment, the characteristic impedance was measured by arranging the signal terminal piece 33 and the ground terminal pieces 31 and 35 each having the thickness of 0.25 mm and the width of 2.2 mm, placing air gap (with a relative dielectric coefficient of 1.0) and epoxy resin (with a relative dielectric coefficient of 3.5), and changing the gap G between the terminal pieces. The graph in FIG. 11 shows the results of this measurement, and A and B in this graph denote the cases where the air gap and the epoxy resin were used, respectively.

Figure 11:
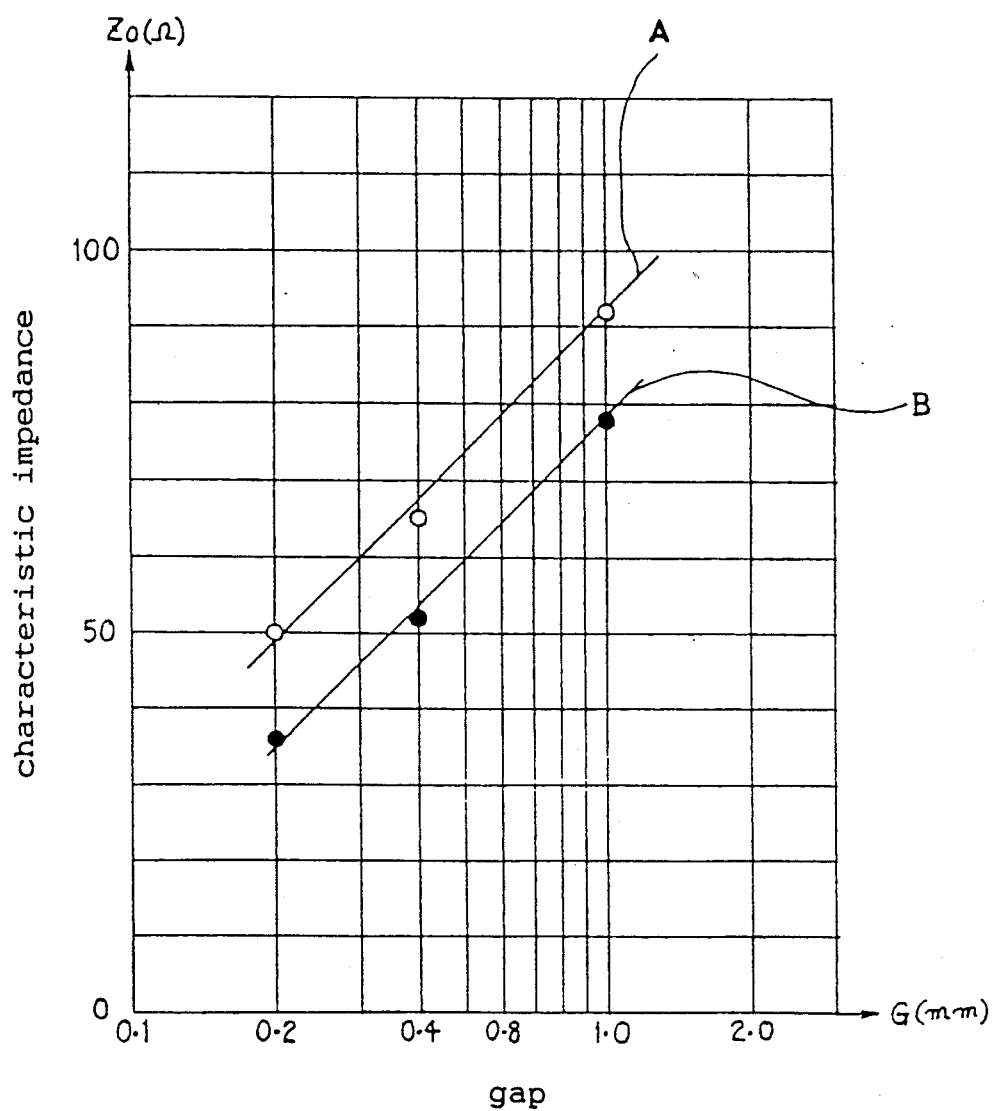
FIG. 11 is a graph showing the relationship between the spacing of the terminal pieces and the characteristic impedance.

As can be seen from FIG. 11, the gap G should be approximately 0.2 mm when a characteristic impedance of 50 ohms is desired, and the signal terminal piece 33 and the ground terminal pieces 31 and 35 are separated by air gaps. The gap G should be approximately 0.7 mm when a characteristic impedance of 75 ohms is desired under the same condition. Therefore, the gap G should be selected in the range between 0.1 mm and 1 mm when the signal terminal pieces 33 and 39 are separated from the associated ground terminal pieces 31, 35, 37 and 41 by air gaps by taking into account manufacturing errors and dimensional tolerance.

FIG. 11 also shows that the gap G should be approximately 0.35 mm when a characteristic impedance of 50 ohms is desired, and the gaps between the signal terminal piece 33 and the ground terminal pieces 31 and 35 are filled with epoxy resin, and approximately 0.9 mm when a characteristic impedance of 75 ohms is desired under the same condition. Therefore, in this case, the gap G should be selected in the range between 0.2 mm and 1.5 mm by taking into account the fluctuation in the relative dielectric coefficient of the epoxy resin as well as manufacturing errors and dimensional tolerance.

Thus, according to the second embodiment in which a pair of ground terminal pieces are arranged on either side of each signal terminal piece, the characteristic impedance is lower as compared with the first embodiment for a given value of the gap G or, in other words, the gap G may be increased for a given characteristic impedance, it is possible to improve the mechanical stability of the signal terminal pieces and the ground terminal pieces.

In either of the illustrated embodiments, the terminal pieces may be fabricated from a lead frame 17 and 43 or, alternatively, separate terminal pieces may be assembled to the base plate by using a jig plate for holding the terminal piece in a required positional relationship.

The above described embodiments consisted of flat package electromagnetic delay lines which are suitable for super high speed performance design, but the present invention may also be applied to other forms of package, such as dual-in-line package (DIP) and single-in-line package (SIP).

Although the present invention has been described in terms of specific embodiments, it is possible to modify and alter details thereof without departing from the spirit of the present invention.

What we claim is:

1. A terminal structure for electronic components, comprising:
   a base plate of an electronic component including an impedance circuit and a ground circuit;
   a signal terminal piece consisting of an electroconductive planar member connected to said impedance circuit at its one end and projecting from said base plate;
   a ground terminal piece consisting of an electroconductive planar member connected to said ground circuit at its one end and projecting from said base plate in a common plane as said signal terminal piece so as to define a gap G therebetween;

wherein said signal terminal piece and said ground terminal piece are fabricated from a lead frame;

external connecting pieces integrally projecting from said signal terminal piece and said ground terminal piece, respectively, and each having a comparatively narrower width; and a solid dielectric body interposed at least between said signal terminal piece and said ground terminal piece;

said gap being in a range between 0.1 mm and 0.6 mm.

2. A terminal structure for electronic components according to claim 1, wherein said electronic component is an electromagnetic delay line comprising a base plate and an impedance line formed thereon.

3. A terminal structure for electronic components according to claim 2, wherein said terminal pieces each comprise an internal connecting piece fitted into a through hole of said base plate, a main part of said terminal piece connected to said internal connecting piece, and an external connecting piece having a relatively small width projecting from another end of said main part.

4. A terminal structure for electronic components according to claim 3, wherein said external connecting pieces of said terminal pieces extend in parallel with said base plate and in parallel with each other.

5. A terminal structure for electronic components, comprising:

a base plate of an electronic component including an impedance circuit and a ground circuit;

a signal terminal piece consisting of an electroconductive planar member connected to said impedance circuit at its one end and projecting from said base plate;

a pair of ground terminal pieces each consisting of an electroconductive planar member connected to said ground circuit at its one end and projecting from said base plate in a common plane as said signal terminal piece on either side of said signal terminal piece so as to define a gap G therebetween;

wherein said signal terminal piece and said pair of ground terminal pieces are fabricated from a lead frame;

external connecting pieces integrally projecting from said signal terminal piece and said ground terminal piece, respectively, at least said external connecting piece projecting from said signal terminal piece having a comparatively narrower width; and said gap being in a range between 0.1 mm and 1.0 mm.

6. A terminal structure for electronic components according to claim 5, wherein said electronic component is an electromagnetic delay line comprising a base plate and an impedance line formed thereon.

7. A terminal structure for electronic components according to claim 6, wherein said terminal pieces each comprise an internal connecting piece fitted into a through hole of said base plate, a main part of said terminal piece connected to said internal connecting piece, and an external connecting piece projecting from another end of said main part.

8. A terminal structure for electronic components according to claim 7, wherein said external connecting pieces of said terminal pieces extend in parallel with said base plate and in parallel with each other.

9. A terminal structure for electronic components, comprising:

a base plate of an electronic component including an impedance circuit and a ground circuit;

a signal terminal piece consisting of an electroconductive planar member connected to said impedance circuit at its one end and projecting from said base plate;

a pair of ground terminal pieces each consisting of an electroconductive planar member connected to said ground circuit at its one end and projecting from said base plate in a common plane as said signal terminal piece on either side of said signal terminal piece so as to define a gap G therebetween;

wherein said signal terminal piece and said pair of ground terminal pieces are fabricated from a lead frame;

a solid dielectric body interposed at least between said signal terminal piece and said ground terminal piece; and external connecting pieces integrally projecting from said signal terminal piece and said ground terminal piece, respectively, at least said external connecting piece projecting from said signal terminal piece having a comparatively narrower width; and said gap being in a range between 0.1 mm and 1.0 mm.

10. A terminal structure for electronic components according to claim 9, wherein said electronic component is an electromagnetic delay line comprising a base plate and an impedance line formed thereon.

11. A terminal structure for electronic components according to claim 10, wherein said terminal pieces each comprise an internal connecting piece fitted into a through hole of said base plate, a main part of said terminal piece connected to said internal connecting piece, and an external connecting piece having a relatively small width projecting from another end of said main part.

12. A terminal structure for electronic components according to claim 11, wherein said external connecting pieces of said terminal pieces extend in parallel with said base plate and in parallel with each other.

* * * * *